(12) United States Patent
Takasu et al.

(10) Patent No.: US 6,936,400 B2
(45) Date of Patent: Aug. 30, 2005

(54) NEGATIVE RESIST COMPOSITION

(75) Inventors: Ryoichi Takasu, Kawasaki (JP); Miwa Miyairi, Kawasaki (JP); Jun Iwashita, Kawasaki (JP); Toshikazu Tachikawa, Kawasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/603,511

(22) Filed: Jun. 25, 2003

(65) Prior Publication Data

US 2004/0009427 A1 Jan. 15, 2004

Related U.S. Application Data

(63) Continuation of application No. PCT/JP03/06009, filed on May 14, 2003.

(30) Foreign Application Priority Data

| May 27, 2002 | (JP) | ......................................... 2002-152699 |
| Dec. 25, 2002 | (JP) | ......................................... 2002-373935 |
| Feb. 20, 2003 | (JP) | ......................................... 2003-042339 |

(51) Int. Cl.$^7$ .............................................. G03F 7/004
(52) U.S. Cl. ...................... 430/270.1; 430/905; 430/910
(58) Field of Search ............................. 430/270.1, 905, 430/910

(56) References Cited

U.S. PATENT DOCUMENTS

2001/0049073 A1   12/2001   Hada et al. ............... 430/270.1
2003/0134232 A1 *  7/2003   Yokoyama et al. ......... 430/312

FOREIGN PATENT DOCUMENTS

| JP | 11-109627   | 4/1999 |
| JP | 2000-56459  | 2/2000 |
| JP | 2000-206694 | 7/2000 |
| JP | 2001-174993 | 6/2001 |
| JP | 2002-090998 | 3/2002 |
| JP | 2003-005370 | 1/2003 |
| JP | 2003-195502 | 7/2003 |

* cited by examiner

*Primary Examiner*—John S. Chu
(74) *Attorney, Agent, or Firm*—Hoffmann & Baron, LLP

(57) ABSTRACT

A negative resist composition is provided which is less likely to swell in an alkali developing solution. An alkali-developable negative resist composition is disclosed comprising a compound (A) which generates an acid upon exposure to radiation, and a resin component (B) which becomes insoluble in alkali under the action of an acid, wherein the component (B) is a resin component containing: (b1) a unit which becomes insoluble in an alkali solution as a result of the formation of a lactone under the action of an acid generated from the component (A), and (b2) a unit having an alcoholic hydroxyl group.

27 Claims, No Drawings

NEGATIVE RESIST COMPOSITION

CROSS-REFERENCE TO RELATED APPLICATION

This is a continuation of International Application No. PCT/JP03/06009, filed May 14, 2003.

BACKGROUND OF THE INVENTION

1. Field of the Invention

The present invention relates to a negative resist composition.

2. Description of the Related Art

Various proposals have hitherto been made for chemical amplification type negative resist compositions. For a resist for exposure light having a wavelength equal to or shorter than that of an ArF excimer laser, a technique of forming a negative pattern by being made insoluble in an alkali solution as a result of intermolecular or intramolecular formation of lactone in a base resin (Japanese Patent Application, First Publication No. 2000-206694) is effective. Similarly, Japanese Patent Application, First Publication No. 2001-174993 discloses a negative resist composition comprising a specific resin component having excellent lactone-forming ability. Such a resist composition has a chemical structure which contributes to sufficient transparency to light in the far ultraviolet region including ArF excimer laser light having a wavelength of 193 nm and high dry etching resistance.

In addition, an alkali concentration of a standard alkali developing solution used in the manufacture of electronic parts such as semiconductor devices and liquid crystal devices is 2.38% by mass. Typical alkali developing solutions include, for example, an aqueous solution of tetramethylammonium hydroxide (abbreviation: TMAH). Although the alkali developing solution having such an alkali concentration can be used in manufacturing lines for electronic parts after being diluted to some extent, the dilution limit is considered to be about 0.1% by mass or higher.

On the other hand, the negative resist composition disclosed in Japanese Patent Application, First Publication No. 2001-174993 has a problem in that it is likely to swell in an alkali developing solution, and a resist pattern having a good profile can be formed by using an the alkali developing solution having a low alkali concentration such as 0.05% by mass or less. That is, in the case in which a trial of developing with an alkali developing solution having a practical alkali concentration of 0.1% by mass or more is made, a resin component, which becomes insoluble in an alkali solution upon exposure to light, swells, and thus a resist pattern having a good profile cannot be formed.

SUMMARY OF THE INVENTION

Under these circumstances, the present invention has been made, and an object thereof is to provide a negative resist composition which is less likely to swell in an alkali developing solution.

To achieve the above object, the negative resist composition of the present invention is an alkali-developable negative resist composition comprising a compound (A) which generates an acid upon exposure to radiation, and a resin component (B) which becomes insoluble in alkali solution under the action of an acid, wherein the component (B) is a resin component containing:

(b1) a unit which becomes insoluble in an alkali solution as a result of the formation of lactone under the action of an acid generated from the component (A), and (b2) a unit having an alcoholic hydroxyl group.

The "unit" means a monomer unit constituting a polymer.

The radiation in the present invention includes, for example, KrF excimer laser light, ArF excimer laser light, $F_2$ excimer laser light, electron rays, soft X-rays, X-rays and EUV (extreme ultraviolet rays).

DETAILED DESCRIPTION OF THE PREFERRED EMBODIMENTS

The respective constitutions of the negative resist composition of the present invention will now be described in detail.

<Compound (A) Which Generates an Acid Upon Exposure to Radiation>

The component (A) is a so-called acid generator.

The component (A) can be appropriately selected from known acid generators used in a conventional chemical amplification type negative resist.

Among these acid generators, an onium salt containing a halogen-substituted alkylsulfonic acid ion as an anion is particularly preferable.

The cation of the onium salt is preferably mono- or diphenyl iodonium, or mono-, di-, or triphenyl phosphonium, which may be substituted or may not be substituted with a lower alkyl group such as methyl group, ethyl group, propyl group, n-butyl group or tert-butyl group, or a lower alkoxy group such as methoxy group or ethoxy group; or dimethyl(4-hydroxynaphthyl) sulfonium.

Also the anion of the onium salt is preferably a fluoroalkylsulfonic acid ion wherein a portion or all of hydrogen atoms of an alkyl group having about 1 to 15 carbon atoms are substituted with a fluorine atom.

Among these anions, a fluoroalkylsulfonic acid ion wherein all of the hydrogen atoms of an alkyl group having 1 to 10 carbon atoms are substituted with a fluorine atom is preferable. The reason is that the strength as sulfonic acid decreases as the carbon chain becomes longer and the fluorination ratio (proportion of fluorine atoms in the alkyl group) decreases.

Specific examples of the onium salt include trifluoromethane sulfonate or nonafluorobutane sulfonate of diphenyl iodonium, trifluoromethane sulfonate or nonafluorobutane sulfonate of bis(4-tert-butylphenyl)iodonium, trifluoromethane sulfonate or nonafluorobutane sulfonate of triphenyl sulfonium, trifluoromethane sulfonate or nonafluorobutane sulfonate of tri(4-methylphenyl)sulfonium, trifluoromethane sulfonate or nonafluorobutane sulfonate of dimethyl(4-hydroxynaphthyl)sulfonium, trifluoromethane sulfonate or nonafluorobutane sulfonate of monophenyldimethyl sulfonium and trifluoromethane sulfonate or nonafluorobutane sulfonate of diphenylmonomethyl sulfonium.

As the component (A), these acid generators can be used alone, or two or more kinds thereof can be used in combination.

Particularly, a mixture of trifluoromethane sulfonate and nonafluorobutane sulfonate is preferable and a mixture thereof in a mass ratio of 1:1 to 2:1 is more preferable. As the sulfonate, a sulfonate of triphenyl sulfosphonium is preferable.

The component (A) is used in an amount within a range from 0.1 to 30 parts by mass, preferably from 0.5 to 20 parts by mass, and more preferably from 1 to 10 parts by mass, based on 100 parts by mass of the component (B). When the amount is less than the lower limit, no image is formed. On the other hand, when the amount exceeds 30 parts by mass, it is not easy to obtain a uniform solution and the storage stability is likely to be impaired.

<Resin Component (B) which Becomes Insoluble in an Alkali Solution Under the Action of an Acid>

The component (B) is a resin component containing:

(b1) a unit which becomes insoluble in an alkali solution as a result of the formation of lactone under the action of an acid generated from the component (A), and (b2) a unit having an alcoholic hydroxyl group.

The component (B) is not specifically limited as long as it contains the unit (b1) and the unit (b2) and may be, for example, a copolymer (which may be either a block copolymer or a random copolymer) containing the unit (b1) and the unit (b2), or a mixture of a polymer which contains the unit (b1) but does not contain the unit (b2) and a polymer which contains the unit (b2) but does not contain the unit (b1). The former copolymer is preferable and a random copolymer is more preferable.

The molar ratio of the unit (b1) to the unit (b2) is preferably within a range from 1:9 to 9:1, and more preferably from 4:6 to 3:7, because a resist pattern, which is superior in definition and causes less swelling, is formed as the amount of the latter increases.

The component (B) may contain other units, in addition to the unit (b1) and the unit (b2). To obtain the effect of the present invention, the total amount of the unit (b1) and the unit (b2) is 50 mol % or more, and preferably 70 mol % or more, based on the component (B).

The aspect containing other units includes, for example, the case wherein the other units are contained in a copolymer (which may be either a block copolymer or a random copolymer) of either or both of the unit (b1) and the unit (b2), or the case wherein a homopolymer containing the other unit is mixed with a resin component containing the unit (b1) and the unit (b2). In particular, a terpolymer or tetrapolymer composed of the unit (b1), the unit (b2) and one or two kinds of the other units is preferable, and a random copolymer is more preferable.

Also the mass-average molecular weight relative to polystyrene standards as measured by gel permeation chromatography of the component (B) is within a range from about 1500 to 10000, and preferably from about 2000 to 5000.

Unit (b1)

The unit (b1) is a unit which becomes insoluble in an alkali solution as a result of the formation of lactone under the action of an acid generated from the component (A). The lactone is preferably lactone which has a lactone ring and also has a monocyclic or polycyclic structure, including the lactone ring. Hereinafter, a unit having the lactone ring is sometimes referred to a lactone unit.

To form such a lactone, it is necessary to have two kinds of functional groups capable of reacting with each other to form lactone in the molecule. When these functional groups are dehydrated under the action of an acid generated from the component (A) to form a lactone, the unit (b1) becomes insoluble in an alkali solution, and thus the entire component (B) becomes insoluble in an alkali solution.

Two kinds of functional groups capable of reacting with each other to form a lactone include, for example, a combination of a hydroxyl group and a carboxyl group. For example, those having a hydroxyl group and a carboxyl group on the side chain of a main resin skeleton (hereinafter sometimes referred to as a lactone precursor unit) are preferable. The unit (b1) may contain the lactone precursor unit and the lactone unit and usually contains them as long as the component (B) is soluble in an alkali solution before exposure and becomes insoluble in an alkali solution after exposure, thereby forming a negative resist pattern.

More specifically, regarding a ratio of the lactone precursor unit to the lactone unit which coexists with the lactone precursor unit, the amount of the former is within a range from about 50 to 80 mol %, while the amount of the latter is within a range from about 50 to 20 mol % before exposure. The amount of the former is preferably within a range from 70 to 80 mol %, while the amount of the latter is preferably within a range from 30 to 20 mol %, because a resist pattern which is excellent in definition can be obtained.

After exposure, the amount of the former is within a range from about 20 to 30 mol %, while the amount of the latter is within a range from about 70 to 80 mol %. The amounts of these units are preferably within the above ranges because a resist pattern which is excellent in definition can be obtained.

Although the lactone precursor unit and the lactone unit coexist, the description of a specific structure of the unit (b1) will be made about the lactone precursor unit unless otherwise specified.

The description of the proportion of the unit (b1) will be made about the entire unit (b1), i.e. the total amount of the lactone precursor unit and the lactone unit coexist unless otherwise specified.

Since the main resin skeleton can be easily synthesized at a low price, it is preferably a unit derived from (meth)acrylic acid. The unit (b1) is preferably a unit wherein hydrogen atoms of the carboxyl group of the unit derived from (meth)acrylic acid are substituted with a group having two functional groups, i.e. a hydroxy acid-containing group.

In the present specification, (meth)acrylic acid includes acrylic acid and/or methacrylic acid.

As lactone formed as a result of dehydration under the action of an acid generated by the acid generator as described above, any of β-lactone, γ-lactone and δ-lactone can be used. That is, the unit (b1) preferably has any of β-hydroxy acid, γ-hydroxy acid and δ-hydroxy acid.

Because of high stability and high lactone-forming ability of hydroxy acid before reacting with the component (A), a group having δ-lactone, i.e., δ-hydroxy acid is preferable.

The unit (b1) is more preferably a unit derived from a (meth)acrylate ester having δ-hydroxy acid bonded to a non-aromatic polycyclic hydrocarbon group. The use of such a unit (b1) exerts the effect of enhancing the transparency to exposure light and the definition and increasing the carbon density in the component (B) thereby to improve the dry etching resistance. As described above, when the non-aromatic polycyclic hydrocarbon group is bonded to the main resin skeleton, a distance between the main resin skeleton and two functional groups increases, thus making it possible to prevent the occurrence of the undesired side reaction.

The non-aromatic polycyclic hydrocarbon group is not specifically limited, and there can be used those which are commonly used in resists for ArF excimer lasers, and examples thereof include crosslinking polycyclic cyclic hydrocarbon groups such as bicyclo[2.2.1]heptyl group, bornyl group, adamanthyl group, tetracyclo[$4.4.0.1^{2.5}.1^{7.10}$] dodecyl group and tricyclo[$5.2.1.0^{2.6}$]decyl group.

Among these, the unit (b1) wherein the non-aromatic polycyclic hydrocarbon group is a group obtained by eliminating two hydrogen atoms from non-substituted or methyl-substituted tricycloalkane is preferable because it can be inexpensively and easily synthesized.

More specifically, the unit (b1) is more preferably a unit represented by the following general formula (I):

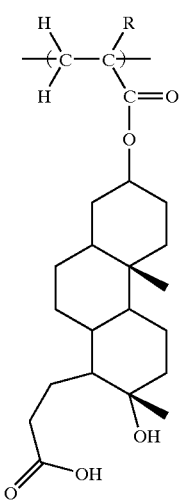

(I)

R represents a hydrogen atom or a lower alkyl group.

The lower alkyl group includes, for example, a straight-chain or branched alkyl group having 1 to 5 carbon atoms, and preferably 1 to 3 carbon atoms. Specific examples thereof include methyl group, ethyl group, propyl group, isopropyl group, n-butyl group, sec-butyl group, tert-butyl group and amyl group.

Unit (b2)

The unit (b2) is a unit having an alcoholic hydroxyl group and is preferably a unit having the alcoholic hydroxyl group in the main resin skeleton or on the side chain.

When the unit (b2) has the alcoholic hydroxyl group, the lactone-forming ability of the unit (b1) can be improved and the solubility of the component (B) in a resist solvent can be enhanced, and thus it is assumed that the action of suppressing swelling in the alkali developing solution can be obtained.

Since the main resin skeleton can be easily synthesized, it is preferably a unit derived from (meth)acrylic acid.

The alcoholic hydroxyl group may be (i) an alcoholic hydroxyl group which is directly bonded to the resin skeleton in the form of a hydroxyalkyl group, or (ii) an alcoholic hydroxyl group which is bonded through an ester in the form of a hydroxyl group-containing non-aromatic polycyclic alkyl group. In the case of the former (i), it is preferably bonded to the acrylate ester at the α-position.

More specifically, the unit (b2) containing the former (i) is a unit derived from an α-hydroxyalkylacrylate ester.

It is more preferable to use the unit (b2) represented by the following general formula (II):

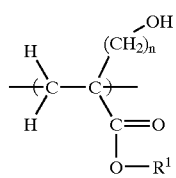

(II)

wherein $R^1$ represents a lower alkyl group, a non-aromatic polycyclic alkyl group, a hydroxyl group-containing non-aromatic polycyclic alkyl group or a lactone-containing non-aromatic polycyclic alkyl group, and n represents an integer of 5 or less.

In $R^1$, the lower alkyl group may be a straight-chain or branched alkyl group having 5 or fewer carbon atoms.

Examples thereof include methyl group, ethyl group, propyl group, isopropyl group, n-butyl group, sec-butyl group, tert-butyl group and amyl group, and a methyl group is preferable.

As the non-aromatic polycyclic alkyl group, there can be used those which are used in the resists for ArF excimer lasers, and examples thereof include crosslinking polycyclic cyclic alkyl groups such as bicyclo[2.2.1]heptyl group, bornyl group, adamanthyl group, tetracyclo[4.4.0.1$^{2.5}$.1$^{7,10}$]dodecyl group and tricyclo[5.2.1.0$^{2,6}$]decyl group.

Also the hydroxyl group-containing non-aromatic polycyclic alkyl group includes, for example, those wherein at least one hydroxyl group is bonded to the crosslinking polycyclic cyclic alkyl group, and specific examples thereof include adamantanol.

The lactone-containing non-aromatic polycyclic alkyl group includes, for example, those wherein lactone is bonded to the groups exemplified in the non-aromatic polycyclic alkyl group.

The unit (b2) having a non-aromatic polycyclic alkyl group, a hydroxy-containing non-aromatic polycyclic alkyl group or a lactone-containing non-aromatic polycyclic alkyl group is effective to enhance dry etching resistance and adhesion between the substrate and the resist layer.

In the formula (II), n of —(CH$_2$)$_n$— is an integer of 1 to 5. Examples thereof include methylene group, ethylene group, propylene group and n-butylene group, and a methylene group is preferable.

The unit (b2) containing (ii) is a unit derived from a hydroxyl group-containing non-aromatic polycyclic alkyl ester of (meth)acrylic acid, and is preferable in view of improvement in dry etching resistance.

The hydroxyl group-containing non-aromatic polycyclic alkyl group to be bonded to the ester includes, for example, those wherein a hydroxyl group is bonded to a non-aromatic polycyclic alkyl group, which are used in a resist for an ArF excimer laser. Specific examples thereof include those wherein a hydroxyl group is bonded to crosslinking polycyclic cyclic alkyl groups such as bicyclo[2.2.1]heptyl group, bornyl group, adamanthyl group, tetracyclo [4.4.0.1$^{2.5}$.1$^{7,10}$]dodecyl group and tricyclo[5.2.1.0$^{2,6}$]decyl group. One or more hydroxyl groups are bonded and, preferably, 1 to 3 hydroxyl groups are bonded.

Particularly, the hydroxyl group-containing non-aromatic polycyclic alkyl group is preferably an adamanthyl group having at least one hydroxyl group.

Furthermore, the unit (b2) is preferably a unit represented by the following general formula (III):

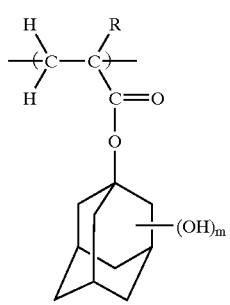

(III)

wherein R has the same meaning as in the formula (I), and an represents an integer of 1 to 3.

m is more preferably 1. The hydroxyl group is preferably bonded to the adamanthyl group at the 3-position.

(1) A compound represented by the following general formula (IV) wherein one hydroxyl group exists and is bonded to the adamanthyl group at the 3-position is more preferable because it is less likely to cause swelling of a resist pattern even when developed with an alkali developing solution having a high alkali concentration and affords a resist pattern with good dry etching resistance.

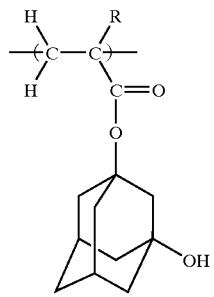

(IV)

wherein R has the same meaning as in the formula (I).

Among the compounds represented by the formula (IV), (2) a compound wherein R is a hydrogen atom is more preferable because it is less likely to cause swelling of a resist pattern even when developed with an alkali developing solution having a high alkali concentration and affords a resist pattern with good dry etching resistance.

Therefore, the negative resist composition containing the component (B) using the unit (b2) described in (1) and (2) can be used for purposes of developing with a developing solution having an alkali concentration of 1.0% by mass or more, and preferably from about 2.0 to 2.5% by mass. As described above, an aqueous solution of TMAH is used as the alkali developing solution.

Therefore, there can be used an alkali developing solution having a concentration of about 0.1% by mass or more which is considered to be used in manufacturing lines for electronic parts. Since a resist pattern can be formed by using a commonly used alkali developing solution having an alkali concentration of 2.38% by mass, a general alkali developing solution can be used as it is without controlling the concentration.

When using the compound (1) (preferably compound (2)), a molar ratio of the constituent unit (b1) to the constituent unit (b2) is within a range from 8:2 to 4:6, and preferably from 7:3 to 5:5, in view of the effect described above. Specific examples of the unit (b2) include units shown in the following [Chemical Formula 8].

[Chemical Formula 8]

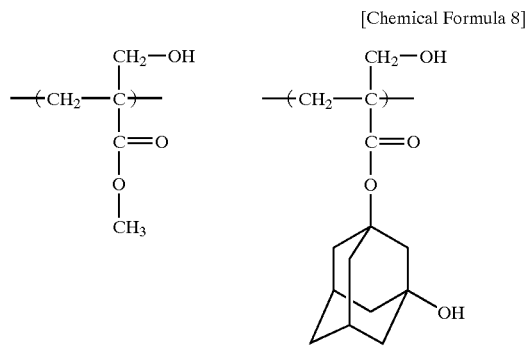

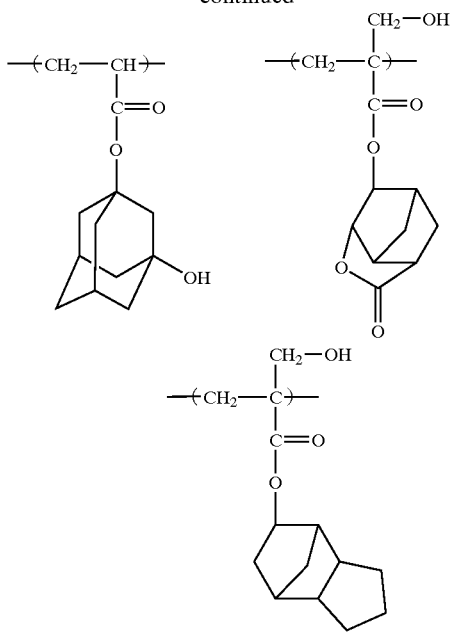

Other Units

Other units which are optionally contained in the component (B), in addition to the unit (b1) and the unit (b2), are not specifically limited as long as the effects of the present invention are not impaired. Other units include, for example, those having a resin skeleton of (meth)acrylic acid.

Specific examples thereof include those wherein a non-aromatic polycyclic hydrocarbon group or a non-aromatic polycyclic hydrocarbon group containing lactone is ester-bonded to the resin skeleton.

The non-aromatic polycyclic hydrocarbon group and the non-aromatic polycyclic hydrocarbon group containing lactone are not specifically limited and there can be used the same groups as exemplified in the description of the unit (b2).

Specific examples thereof include units shown in the following [Chemical Formula 9].

[Chemical Formula 9]

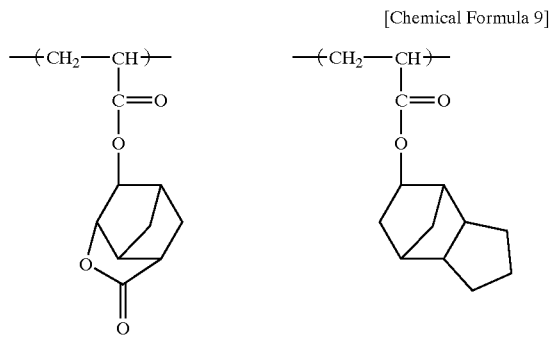

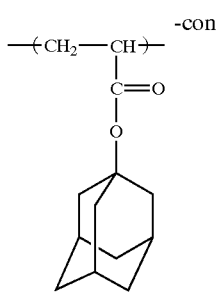

The component (B) can be prepared by a conventional known method.

A copolymer of the unit (b1) and the unit (b2) can be obtained, for example, by polymerizing a monomer (b1)' corresponding to the unit (b1) with a monomer (b2)' corresponding to the unit (b2).

The monomer (b2)' is sold on the market and is easily commercially available.

The monomer (b1)' can be obtained, for example, with reference to a known method described in Japanese Patent Application, First Publication No. 2001-174993. For example, androsterone is esterified with (meth)acrylic acid or a derivative having high reactivity such as a chloride thereof in the presence of a basic catalyst to obtain an esterified compound. Then, the esterified compound is oxidized by a known method using hydrogen peroxide to form lactone and the resulting lactone is hydrolyzed with alkali, thereby causing ring opening to obtain a monomer (b1)'.

Specifically, a polymer can be obtained by radical polymerization of the monomer (b1)' thus obtained and methyl (α-hydroxymethyl)acrylate.

In the process of synthesizing the monomer (b1)' from androsterone, after synthesizing lactone, the resulting lactone and the monomer (b2)' are radically polymerized to obtain a polymer, and then ring opening of the lactone moiety is carried out by alkali hydrolysis to obtain a polymer. The polymer thus obtained can be used as the component (B).

Specifically, androsterone is esterified with (meth)acrylic acid or a derivative having high reactivity such as a chloride thereof in the presence of a basic catalyst to obtain an esterified compound. Then, the esterified compound is oxidized with an oxidizing agent such as hydrogen peroxide to obtain lactone. A polymer can be obtained by radical polymerization of a lactone monomer and a (meth)acrylate ester of adamantanol.

Finally, the polymer is hydrolyzed with alkali to obtain a polymer wherein the lactone moiety is converted into δ-hydroxy acid. Even after being hydrolyzed as described above, both of the unit converted into α-hydroxy acid and the lactone unit usually exist.

The radical polymerization may be conducted by a known method. For example, the radical polymerization may be conducted by dissolving a required monomer in a solvent such as tetrahydrofuran, ethyl acetate, methyl isobutyl ketone or methyl ethyl ketone, adding a radical polymerization initiator thereto and heating the mixture.

Examples of the polymerization initiator include azobisisobutyronitrile (AIBN) (service temperature: 60 to 90° C.), 2,2'-azobis-(2,4-dimethylvaleronitrile (service temperature: 45 to 70° C.)), 2,2'-azobis-(2-methylisobutyronitrile) (service temperature: 60 to 95° C.), tert-butylperoctoate (service temperature: 75 to 100° C.), 1,1'-azobis-(cyclohexane-1-carbonitrile) (service temperature: 80 to 110° C.), 1-[(1-diazo-1-methylethyl)azo]formamide (service temperature: 95 to 120° C.) and dimethyl-2-2'-azobisobutylate. These polymerization initiators can be used alone or in combination.

Particularly, AIBN and dimethyl-2-2'-azobisobutylate are preferably used as a general-purpose polymerization initiator.

Then, the polymeric compound-containing reaction solution thus obtained is added dropwise in a large amount of a poor solvent such as isopropanol, methanol, water, n-heptane or n-hexane, thereby to deposit a polymer. The resulting deposit is collected by filtration and is dried to obtain a resin component (B). This process is not required according to circumstances, but is effective to remove the unreacted monomer and the polymerization initiator remaining in the reaction solution. When these unreacted compounds remain, they are likely to exert an adverse influence on resist performances and, therefore, they are preferably removed.

<Solvent (C)>

The negative resist composition of the present invention is preferably used in a form wherein the component (A), the component (B), and optionally mixed other components described hereinafter, are dissolved in the solvent (C).

Examples of the solvent (C) include known organic solvents, for example, ketones such as acetone, methyl ethyl ketone, cyclohexanone, methyl isoamyl ketone and 2-heptane; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol or dipropylene glycol monoacetate, or monomethyl ether, monoethyl ether, monopropyl ether, monobutyl ether or monophenyl ether thereof, preferably propylene glycol monomethyl ether (abbreviation: PGME) and propylene glycol monomethyl ether acetate (abbreviation: PGMEA); cyclic ethers such as dioxane; esters such as methyl lactate, ethyl lactate, methyl acetate, ethyl acetate, butyl acetate, methyl pyruvate, ethyl pyruvate, methyl methoxypropionate and ethyl ethoxypropionate; and amide type solvents such as N,N-dimethylformamide, N,N-dimethylacetamide and N-methyl-2-pyrrolidone.

These solvents may be used alone, or two or more kinds thereof may be used in combination.

It is preferable to mix water with the solvent (C) because the stability over time of the resist composition is improved. In view of the effect, the amount of water is controlled within a range from 5 to 20% by mass, and preferably from 5 to 15% by mass, based on 100% by mass of the organic solvent contained in the solvent (C) (for example, organic solvent selected from one, two or more kinds of the organic solvents described above).

In particular, a mixed solvent of PGME and water is preferable and water is mixed with PGME in an amount within a range from 5 to 20% by mass, and preferably from 5 to 15% by mass, because the resulting negative resist composition is superior in stability over time.

The component (B) has good solubility in a commonly used solvent (particularly PGMEA or PGME) for the resist and also has the effect of improving the storage stability of the negative resist composition.

<Other Components>

To the negative resist composition of the present invention, commonly used miscible additives such as additional resins, plasticizers, stabilizers, colorants, surfactants and amines can be optionally added to improve performances of the resist film.

<Method for Use of Negative Resist Composition>

The negative resist composition of the present invention can be applied, for example, to a resist pattern forming method of a conventional photoresist technique.

First, a solution of the negative resist composition of the present invention is applied on a substrate such as silicon wafer using a spinner, and this is then dried to form a photosensitive layer. The substrate is not specifically limited and may be various substrates on which a conventional negative resist is applied, for example, a silicon wafer, a silicon wafer on which an organic or inorganic type antireflection film is provided, and a glass substrate.

Furthermore, the substrate having a photosensitive layer formed thereon is exposed to KrF excimer laser light, ArF excimer laser light, $F_2$ excimer laser light, EUV (Extreme ultraviolet light), electron rays, soft X-rays, or X-rays through a desired mask pattern using a reducing-type projection aligner, or is directly formed with a pattern, and is then heated.

The exposed substrate is developed with a developing solution such as aqueous alkali solution. An image faithful to the mask pattern can be obtained by this forming method.

The developing solution is not specifically limited and a commonly used aqueous alkali solution can be used.

The negative resist composition of the present invention has an effect such that it is less likely to swell in an alkali developing solution as compared with a conventional one, and thus a resist pattern having a good profile can be obtained.

For example, the alkali concentration of the developing solution is controlled within a range from 0.05 to 2.38% by mass, and preferably from 0.1 to 0.5% by mass, in the case of the negative resist composition using the component (B) which does not use the constituent unit (1) (preferably (2)).

As described above, the alkali concentration is controlled within a range from 0.05 to 2.38% by mass, and preferably from 0.5 to 1.0% by mass, in the case of the negative resist composition using the component (B) which uses the constituent unit (1) (preferably (2)).

As described above, an aqueous solution of TMAH is exclusively used as the alkali developing solution.

EXAMPLES

The Present Invention will be Described in Detail by way of Examples.

Synthesis Example 1

The component (B) used in Example 2 was synthesized by the hydrolysis reaction and the polymerization reaction shown in the following [Chemical Formula 10]. A ratio of x to y in [Chemical Formula 10] is shown in Table 1. Also the component (B) used in Examples 1, 3 and 4 was synthesized in the same manner, except that the ratio of x to y is as shown in Table 1.

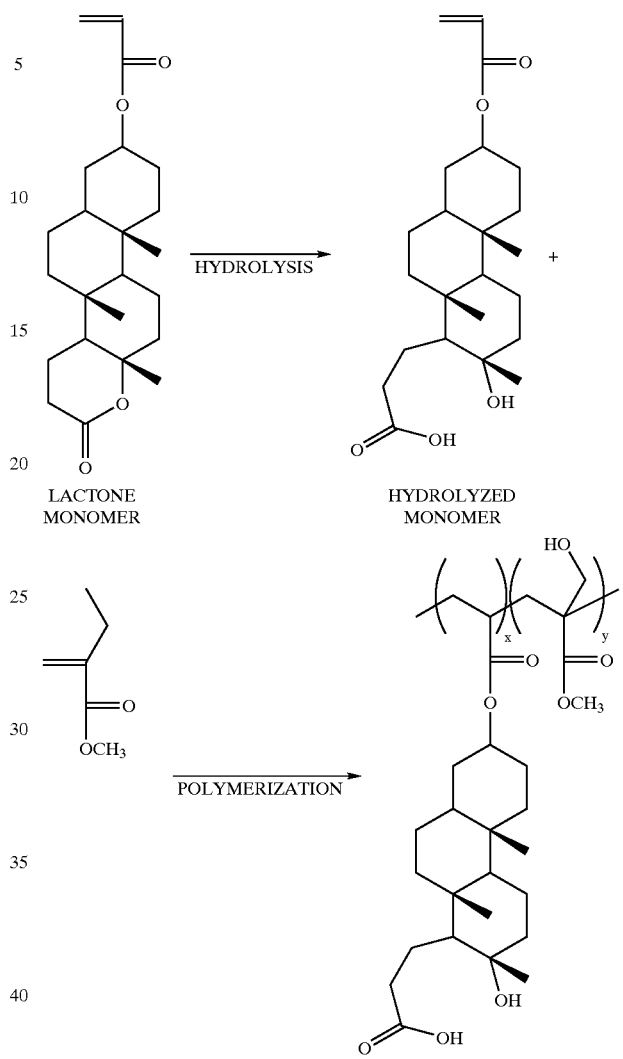

[Chemical Formula 10]

LACTONE MONOMER

HYDROLYZED MONOMER

POLYMERIZATION

Hydrolysis Reaction

First, 20 g (53.5 mmol) of a lactone monomer shown in [Chemical Formula 10] was dissolved in 700 g of tetrahydrofuran (THF) and about 615 g (about 80 mmol: 1.5 equivalents) of an aqueous 0.13N sodium hydroxide solution was added dropwise, followed by stirring for 4 hours.

Then, the mixture was neutralized with 0.04N HCl until the pH became about 4.

An operation of extracting with 500 ml of ethyl acetate was conducted twice and an operation of washing an ethyl acetate layer with 300 ml of pure water was conducted three times. As a result, the pH became about 6.

Furthermore, the ethyl acetate layer was concentrated and dried and dissolved in a small amount of THF, and after depositing with 2000 ml of heptane, granular crystals were recovered. The yield was 11.5 g.

Polymerization Reaction

Then, 10 g (25.5 mmol) of the resulting hydrolyzed monomer (monomer constituting the unit (b1)), 1.972 g (17 mmol) of a monomer (methyl α-hydroxymethylacrylate) constituting the unit (b2) shown in [Chemical Formula 10] [a weight ratio of the monomer constituting the unit (b1) to the monomer constituting the unit (b2) is 6:4] and 0.49 g (2.125 mmol) of dimethyl-2-2'-azobisobutylate (H₃COOC—C(CH₃)₂—N=N N—C(CH₃)₂—COOCH₃) as a polymerization initiator were dissolved in 250 g of THF and 120 g of an aqueous 0.2N NaOH solution.

After nitrogen bubbling for about 10 minutes, the mixture was stirred for 5 hours while heating using a water bath at 75 to 80° C.

After mixing 360 g of THF with 360 g of water, the mixture was neutralized with 0.02N HCl until the pH became about 4.

An operation of extracting with 500 ml of ethyl acetate was conducted twice and an operation of washing an ethyl acetate layer with 300 ml of pure water was conducted three times. As a result, the pH became about 6.

After depositing with a mixed solvent of 2500 ml of heptane and 250 ml of acetone, granular crystals were recovered.

The resulting resin had a mass-average molecular weight of about 2900.

Synthesis Example 2

The component (B) used in Example 17 was synthesized by the polymerization reaction and the hydrolysis reaction shown in the following Chemical Formula 11.

[Chemical Formula 11]

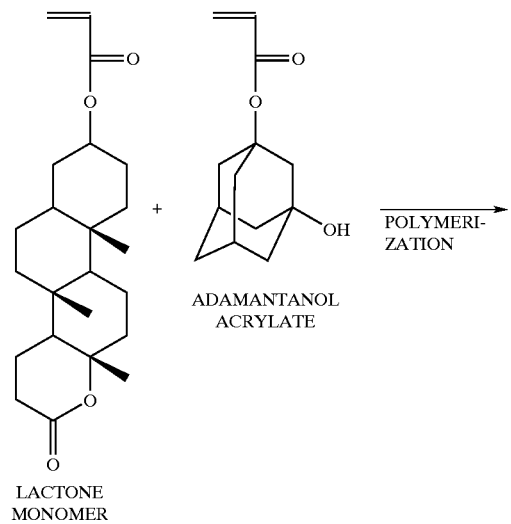

LACTONE MONOMER

ADAMANTANOL ACRYLATE

POLYMERIZATION →

-continued

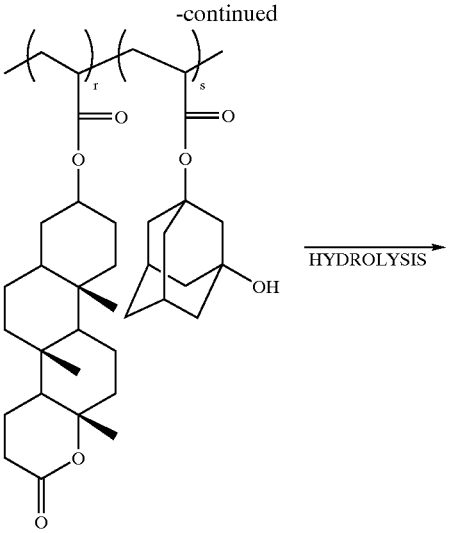

HYDROLYSIS →

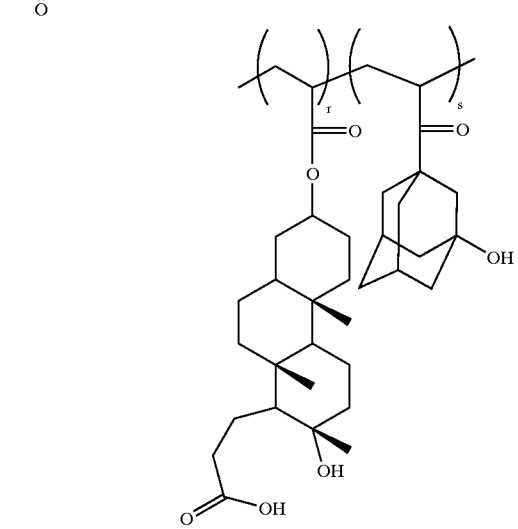

Polymerization Reaction 15 g (40.1 mmol) of a lactone monomer shown in [Chemical Formula 11], 5.94 g (26.75 mmol) of adamantanol acrylate and 0.77 g (3.34 mmol) of dimethyl-2-2'-azobisobutylate as the same polymerization initiator used in Synthesis Example 1 were dissolved in 400 g of THF.

After nitrogen bubbling for about 10 minutes, the mixture was stirred for 5 hours while heating using a water bath at 75 to 80° C.

After concentrating to about 250 g and depositing with a mixed solvent of 2500 ml of heptane and 250 ml of acetone, granular crystals were recovered. The yield was 19.5 g and the resulting resin had a mass-average molecular weight of about 1800.

Hydrolysis Reaction 19 g of the resulting resin was dissolved in 800 g of THF and about 460 g (about 60 mmol: 1.5 equivalents) of an aqueous 0.13N sodium hydroxide solution was added dropwise, followed by stirring for 4 hours.

Then, the mixture was neutralized with 0.04N HCl until the pH became about 4.

An operation of extracting with 500 ml of ethyl acetate was conducted twice and an operation of washing an ethyl acetate layer with 300 ml of pure water was conducted three times. As a result, the pH became about 6.

Furthermore, the ethyl acetate layer was concentrated and dried and was dissolved in a small amount of THF, and after depositing with a mixed solvent of 2000 ml of heptane and 100 ml of acetone, granular crystals were recovered.

Examples 1 to 4

(TMAH Concentration: 0.05% by Mass)>

Component (A):

| | |
|---|---|
| Triphenylsulfoonium trifluoromethane sulfonate | 1 part by mass |
| Triphenylsulfonium nonafluorobutane sulfonate | 0.68 parts by mass |
| Other components: | |
| 4-phenylpyridine | 0.2 parts by mass |
| Fluorine-silicon type surfactant R08 (manufactured by DAINIPPON INK & CHEMICALS Co., Ltd.) | 0.1 parts by mass |

The component (A) and other components described above as well as 100 parts by mass of the component (B) (resin component: random copolymer) represented by the following structural formula:

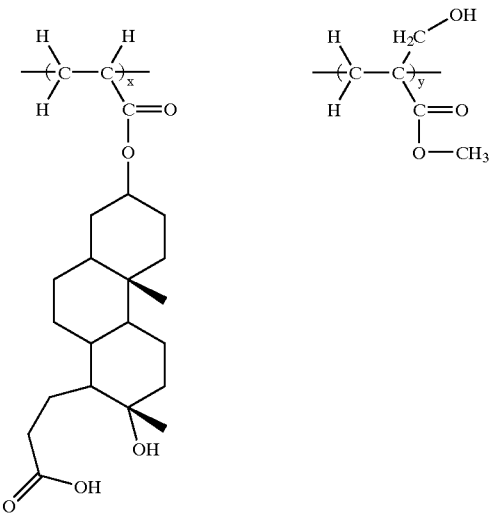

described in Table 1 were dissolved in a mixed solvent of 1200 parts by mass propylene glycol monomethyl ether and 100 parts by mass of water to obtain a uniform negative resist solution (negative resist composition).

On a silicon wafer, an organic antireflection film AR-19 (manufactured by Shipley Co.) was formed in a thickness of 82 nm by heating at 215° C. for 60 seconds, and then the above resist solution was applied on the antireflection film using a spinner and was dried on a hot plate at 100° C. (prebaking) for 60 seconds to form a resist layer having a thickness of 300 nm.

Using an ArF exposure apparatus NSR-S302 (manufactured by Nikon Corporation, NA=0.60), the silicon wafer having a resist layer formed thereon was selectively exposed to an ArF excimer laser (193 nm) through a mask, and was then subjected to a post-exposure baking (PEB) treatment at 100° C. for 60 seconds.

The exposed silicon wafer was developed with an aqueous tetramethylammonium hydroxide solution having a concentration of 0.05% by mass at 23° C. for 30 seconds, washed with water, dried, and then post-baked at 100° C. for 60 seconds.

Resolution limit of the resist pattern obtained by the operation, cross sectional profile (represented by line width (nm) and its orthogonality of resist; the same shall apply hereinafter) of the resist pattern, and resist pattern size, sensitivity and degree of swelling at the profile are summarized in Table 1. In the table, the symbol "L&S" means a line-and-space pattern.

Comparative Example 1 (TMAH Concentration: 0.05% by Mass)

In the same manner as in Example 1, except that the resin component was replaced by a polymer (random copolymer) represented by the following structural formula:

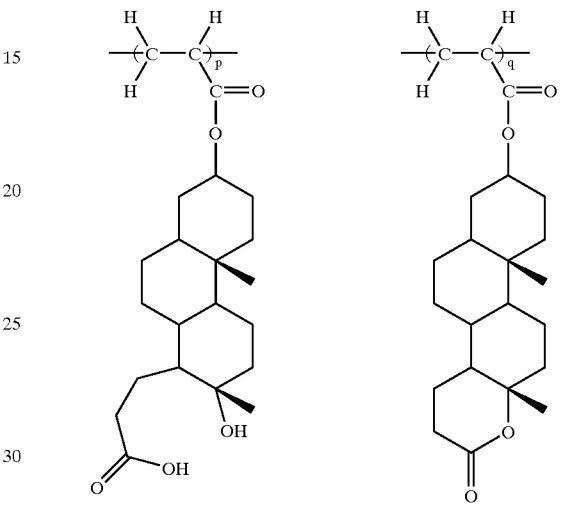

described in Table 1 Example 1, a negative resist solution was obtained.

The same operation as in Example 1 was conducted to form a resist pattern. Resolution limit of the resist pattern obtained by the operation, cross sectional profile of the resist pattern, and resist pattern size, sensitivity and degree of swelling at the profile are summarized in Table 1.

Examples 5 to 8 (TMAH Concentration: 0.1% by Mass)

The same operations as in Example 1 to 4 were conducted, except that the TMAH concentration of 0.05% by mass was changed to 0.1% by mass, to form a resist pattern. Resolution limit of the resulting resist pattern, cross sectional profile of the resist pattern, and resist pattern size, sensitivity and degree of swelling at the profile are summarized in Table 2.

Comparative Example 2 (TMAH Concentration: 0.1% by Mass)

The same operation as in Comparative Example 1 was conducted, except that the TMAH concentration of 0.05% by mass was changed to 0.1% by mass, to form a resist pattern. Resolution limit of the resulting resist pattern, cross sectional profile of the resist pattern, and resist pattern size, sensitivity and degree of swelling at the profile are summarized in Table 2.

Examples 9 to 12 (TMAH Concentration: 0.2% by Mass)

The same operations as in Examples 1 to 4 were conducted, except that the TMAH concentration of 0.05% by mass was changed to 0.2% by mass, to form a resist pattern. Resolution limit of the resulting resist pattern, cross sectional profile of the resist pattern, and resist pattern size, sensitivity and degree of swelling at the profile are summarized in Table 3.

Comparative Example 3 (TMAH Concentration: 0.2% by Mass)

The same operation as in Comparative Example 1 was conducted, except that the TMAH concentration of 0.05% by mass was changed to 0.2% by mass, to form a resist pattern. Resolution limit of the resulting resist pattern, cross sectional profile of the resist pattern, and resist pattern size, sensitivity and degree of swelling at the profile are summarized in Table 3.

Examples 13 to 16 (TMAH Concentration: 0.5% by Mass)

The same operations as in Examples 1 to 4 were conducted, except that the TMAH concentration of 0.05% by mass was changed to 0.5% by mass, to form a resist pattern. Resolution limit of the resulting resist pattern, cross sectional profile of the resist pattern, and resist pattern size, sensitivity and degree of swelling at the profile are summarized in Table 4.

Comparative Example 4 (TMAH Concentration: 0.5% by Mass)

The same operation as in Comparative Example 1 was conducted, except that the TMAH concentration of 0.05% by mass was changed to 0.5% by mass, to form a resist pattern. Resolution limit of the resulting resist pattern, cross sectional profile of the resist pattern, and resist pattern size, sensitivity and degree of swelling at the profile are summarized in Table 4.

TABLE 1

(Concentration of developing solution: 0.05% by mass)

| Examples or Comparative Examples | Polymer x:y or p:q | Mass-average molecular weight | Dispersion degree | Resolution limit (nm) | Resist pattern profile | Sensitivity (mJ/cm$^2$) evaluated by 1:1 L & S pattern of 180 nm | Swelling degree evaluated by 1:1 L & S pattern of 180 nm |
|---|---|---|---|---|---|---|---|
| Example 1 | 69:31 | 2600 | 2.11 | 120 | high orthogonality at 130 nm, good | 21 | none |
| Example 2 | 60:40 | 2900 | 1.65 | 120 | high orthogonality at 130 nm, good | 21 | none |
| Example 3 | 51:49 | 2900 | 1.66 | 120 | high orthogonality at 130 nm, good | 19 | none |
| Example 4 | 37:63 | 2900 | 2.04 | 120 | high othogonality at 130 nm, good | 21 | none |
| Comparative Example 1 | 68:32 | 2700 | 2.03 | 140 | poor even at 180 nm | 14.5 | none |

TABLE 2

(Concentration of developing solution: 0.1% by mass)

| Examples or Comparative Examples | Polymer x:y or p:q | Resolution limit (nm) | Resist pattern profile | Sensitivity (mJ/cm$^2$) evaluated by 1:1 L & S pattern of 180 nm | Swelling degree evaluated by 1:1 L & S pattern of 180 nm |
|---|---|---|---|---|---|
| Example 5 | 69:31 the same polymer as in Example 1 | 130 | high orthogonality at 140 nm, good | 21 | none |
| Example 6 | 60:40 the same polymer as in Example 2 | 130 | high orthogonality at 140 nm, good | 20 | none |
| Example 7 | 51:49 the same polymer as in Example 3 | 130 | high orthogonality at 130 nm, good | 19 | none |
| Example 8 | 37:63 the same polymer as in Example 4 | 130 | high orthogonality at 130 nm, good | 21.5 | none |
| Comparative Example 2 | 68:32 the same polymer as in Comparative Example 1 | 180 | poor even at 180 nm | 14.5 | swelling observed |

TABLE 3

(Concentration of developing solution: 0.2% by mass)

| Examples or Comparative Examples | Polymer x:y or p:q | Resolution limit (nm) | Resist pattern profile | Sensitivity (mJ/cm$^2$) evaluated by 1:1 L & S pattern of 180 nm | Swelling degree evaluated by 1:1 L & S pattern of 180 nm |
| --- | --- | --- | --- | --- | --- |
| Example 9 | 69:31 the same polymer as in Example 1 | 140 | high orthogonality at 140 nm, good | 21.5 | none |
| Example 10 | 60:40 the same polymer as in Example 2 | 140 | high orthogonality at 140 nm, good | 20.5 | none |
| Example 11 | 51:49 the same polymer as in Example 3 | 140 | high orthogonality at 140 nm, good | 19 | none |
| Example 12 | 37:63 the same polymer as in Example 4 | 130 | high orthogonality at 130 nm, good | 23 | none |
| Comparative Example 3 | 68:32 the same polymer as in Comparative Example 1 | not resolved | impossible to form a pattern | impossible to evaluate | swelling observed |

TABLE 4

(Concentration of developing solution: 0.2% by mass)

| Examples or Comparative Examples | Polymer x:y or p:q | Resolution limit (nm) | Resist pattern profile | Sensitivity (mJ/cm$^2$) evaluated by 1:1 L & S pattern of 180 nm | Swelling degree evaluated by 1:1 L & S pattern of 180 nm |
| --- | --- | --- | --- | --- | --- |
| Example 13 | 69:31 the same polymer as in Example 1 | 140 | high orthogonality at 150 nm, good | 21 | slight swelling observed |
| Example 14 | 60:40 polymer as in Example 2 | 140 | high orthogonality at 140 nm, good | 20 | none |
| Example 15 | 51:49 the same polymer as in Example 3 | 140 | high orthogonality at 140 nm, good | 19 | none |
| Example 16 | 37:63 the same polymer as in Example 4 | 130 | high orthogonality at 130 nm, good | 24 | none |
| Comparative Example 4 | 68:32 the same polymer as in Comparative Example 1 | not resolved | impossible to form a pattern | impossibletoevaluate | swelling observed |

As is apparent from the results shown in Table 1 to Table 4, in any case wherein the TMAH concentration of the developing solution is within a range from 0.05 to 0.5% by mass, the negative resist compositions of the Examples of the present invention exhibited small resolution limit, good resist pattern shape, high sensitivity and less swelling as compared with the Comparative Examples.

Thus, it could be confirmed that a good resist pattern can be obtained without causing swelling by using the negative resist compositions of the Examples of the invention.

Example 17 (TMAH Concentration: 0.2% by Mass)
Component (A):

| | |
| --- | --- |
| Triphenylsulfonium trifluoromethane sulfonate | 1 part by mass |
| Triphenylsulfonium nonafluorobutane sulfonate | 0.68 parts by mass |
| Other components: | |
| 4-phenylpyridine | 0.2 parts by mass |
| Fluorine-silicon type surfactant R104 (manufactured by DAINIPPON INK & CHEMICALS Co., Ltd.) | 0.1 parts by mass |

The component (A) and other components described above as well as 100 parts of the component (B) (resin component: random copolymer, r:s=60:40, Mw=2000) represented by the following structural formula:

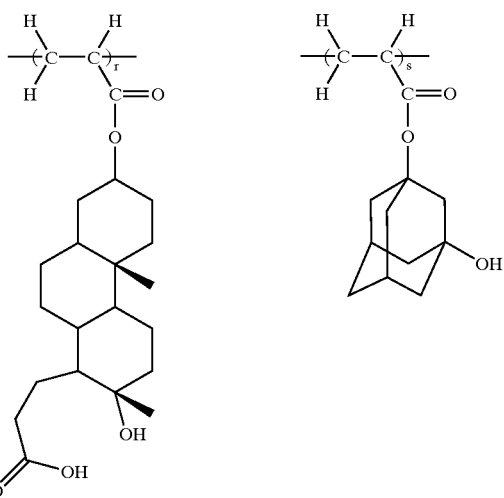

described in Table 5 were dissolved in a mixed solvent of 1200 parts by mass propylene glycol monomethyl ether and 100 parts by mass of water to obtain a uniform negative resist solution (negative resist composition).

In the same manner as in Example 1, except that the thickness of the resist layer was changed to 250 nm, the temperature of PEB was changed to 120° C. and the concentration of the aqueous tetramethylammonium hydroxide solution was changed to 0.2% by mass, a resist pattern was obtained.

In the same manner as in Example 1, the resist pattern obtained by the operation was evaluated. The results are summarized in Table 5.

The results of Comparative Example 3 developed with the alkali developing solution having the same concentration are shown in Table 5, for comparison with Example 17.

Example 18 (TMAH Concentration: 2.38% by Mass)

In the same manner as in Example 17, except that the concentration of the aqueous tetramethylammonium hydroxide solution was changed to 2.38% by mass, a resist pattern was obtained.

In the same manner as in Example 1, the resist pattern obtained by the operation was evaluated. The results are summarized in Table 6.

Comparative Example 5 (TMAH Concentration: 2.38% by Mass)

In the same manner as in Comparative Example 1, except that the concentration of the aqueous tetramethylammonium hydroxide solution was changed to 2.38% by mass, a resist pattern was obtained.

In the same manner as in Example 1, the resist pattern obtained by the operation was evaluated. The results are summarized in Table 6.

TABLE 5

(Concentration of developing solution: 0.2% by mass)

| Examples or Comparative Examples | Polymer r:s or p:q | Resolution limit (nm) | Resist pattern profile | Sensitivity (mJ/cm$^2$) evaluated by 1:1 L & S pattern of 180 nm | Swelling degree evaluated by 1:1 L & S pattern of 180 nm |
|---|---|---|---|---|---|
| Example 17 | 60:40 | 130 | high orthogonality at 150 nm, good | 17.5 | none |
| Comparative Example 3 | 68:32 the same polymer as in Comparative Example 1 | not resolved | impossible to form a pattern | impossible to evaluate | swelling observed |

TABLE 6

(Concentration of developing solution: 2.38% by mass)

| Examples or Comparative Examples | Polymer r:s or p:q | Resolution limit (nm) | Resist pattern profile | Sensitivity (mJ/cm$^2$) evaluated by 1:1 L & S pattern of 180 nm | Swelling degree evaluated by 1:1 L & S pattern of 180 nm |
|---|---|---|---|---|---|
| Example 18 | 60:40 | 130 | high orthogonality at 150 nm, good | 16 | none |
| Comparative Example 5 | 68:32 the same polymer as in Comparative Example 1 | not resolved | impossible to form a pattern | impossible to evaluate | swelling observed |

As is apparent from the results shown in Table 5 and Table 6, the negative compositions of the Examples of the present invention exhibited small resolution limit, good resist pattern shape, high sensitivity and less swelling as compared with the Comparative Examples.

Thus, it could be confirmed that a good resist pattern with less swelling can be obtained even if the alkali concentration is high, such as 2.38% by mass, shown in Table 6.

INDUSTRIAL APPLICABILITY

As described above, the negative resist composition of the present invention is industrially useful because it is less likely to swell in an alkali developing solution and yields a good resist pattern.

What is claimed is:

1. An alkali-developable negative resist composition comprising a compound (A) which generates an acid upon exposure to radiation, and a resin component (B) which is made insoluble in alkali under the action of an acid, wherein the component (B) is a resin component containing:
   (b 1) a unit which becomes insoluble in an alkali solution as a result of the formation of a lactone under the action of an acid generated from the component (A), and
   (b2) a unit having an alcoholic hydroxyl group.

2. The negative resist composition according to claim 1, wherein the lactone is δ-lactone.

3. The negative resist composition according to claim 2, wherein the unit (b1) is a unit derived from a (meth)acrylate ester having δ-hydroxy acid bonded to a non-aromatic polycyclic hydrocarbon group.

4. The negative resist composition according to claim 3, wherein the non-aromatic polycyclic hydrocarbon group is a group in which two hydrogen atoms are eliminated from a non-substituted or methyl-substituted tricycloalkane.

5. The negative resist composition according to claim 4, wherein the unit (b1) is a unit represented by the following general formula (I):

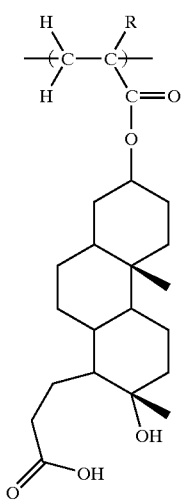

(I)

wherein R represents a hydrogen atom or a lower alkyl group.

6. The negative resist composition according to claim 1, wherein the unit (b2) is (i) a unit derived from an α-hydroxyalkyl acrylate ester.

7. The negative resist composition according to claim 6, wherein the unit (b2) is a unit represented by the following general formula (II):

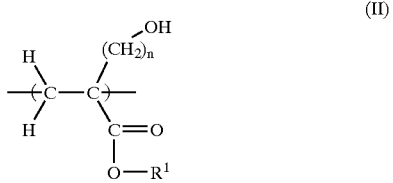

(II)

wherein $R^1$ represents a lower alkyl group, a non-aromatic polycyclic alkyl group, a hydroxyl group-containing non-aromatic polycyclic alkyl group or a lactone-containing non-aromatic polycyclic alkyl group, and n represents an integer of 5 or less.

8. The negative resist composition according to claim 7, wherein $R^1$ is a lower alkyl group.

9. The negative resist composition according to claim 8, wherein $R^1$ is a methyl group.

10. The negative resist composition according to claim 7, wherein n is 1.

11. The negative resist composition according to claim 1, wherein the unit (b2) is a unit derived from a hydroxyl group-containing non-aromatic polycyclic alkyl ester of (meth)acrylic acid.

12. The negative resist composition according to claim 11, wherein the hydroxyl group-containing non-aromatic polycyclic alkyl group, which constitutes the hydroxyl group-containing non-aromatic polycyclic alkyl ester, is an adamanthyl group having at least one hydroxyl group.

13. The negative resist composition according to claim 12, wherein the unit (b2) is a unit represented by the following general formula (III):

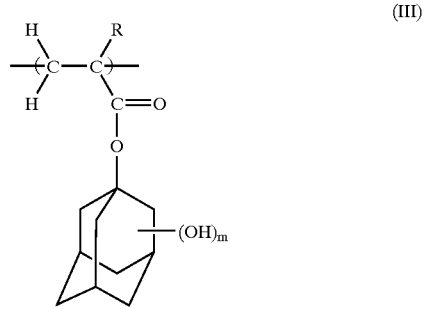

(III)

wherein R represents a hydrogen atom or a lower alkyl group, and m represents an integer of 1 to 3.

14. The negative resist composition according to claim 13, wherein one hydroxyl group exists and the hydroxyl group is bonded to the adamanthyl group at the 3-position in the general formula (III).

15. The negative resist composition according to claim 14, wherein R is a hydrogen atom in the general formula (III).

16. The negative resist composition according to claim 14 for the development with an alkali developing solution having an alkali concentration of 1.0% by mass or more.

17. The negative resist composition according to claim 1, wherein the component (B) is a copolymer containing the unit (b1) and the unit (b2) in a molar ratio of 1:9 to 9:1.

18. The negative resist composition according to claim 11, wherein the component (B) is a copolymer containing the unit (b1) and the unit (b2) in a molar ratio of 1:9 to 9:1.

19. The negative resist composition according to claim 14, wherein the component (B) is a copolymer containing the unit (b1) and the unit (b2) in a molar ratio of 8:2 to 4:6.

20. The negative resist composition according to claim 19, wherein the component (B) is a copolymer containing the unit (b1) and the unit (b2) in a molar ratio of 7:3 to 5:5.

21. The negative resist composition according to claim 1, further comprising a solvent (C), the solvent (C) containing water.

22. The negative resist composition according to claim 11, further comprising a solvent (C), the solvent (C) containing water.

23. The negative resist composition according to claim 21, wherein the solvent (C) contains propylene glycol monomethyl ether and water.

24. The negative resist composition according to claim 1, wherein the molar ratio of the (b1) unit to the (b2) unit is within a range from 1:9 to 9:1.

25. The negative resist composition according to claim 1, wherein the molar ratio of the (b1) unit to the (b2) unit is within a range from 4:6 to 3:7.

26. The negative resist composition according to claim 1, wherein the total amount of the unit (b1) and the unit (b2) is 50 mol % or more based on the component (B).

27. The negative resist composition according to claim 1, wherein the total amount of the unit (b1) and the unit (b2) is 70 mol % or more based on the component (B).

* * * * *